United States Patent
Parriaux et al.

(10) Patent No.: US 7,778,305 B2
(45) Date of Patent: Aug. 17, 2010

(54) MIRROR STRUCTURE AND LASER DEVICE COMPRISING SUCH A MIRROR STRUCTURE

(75) Inventors: Olivier Parriaux, Saint-Etienne (FR); Alexandre Tishchenko, Saint-Etienne (FR); Nikolay Lyndin, Moscow (RU); Jean-François Bisson, Chofu (JP)

(73) Assignee: Université Jean-Monnet, Saint-Etienne (FR)

( * ) Notice: Subject to any disclaimer, the term of this patent is extended or adjusted under 35 U.S.C. 154(b) by 167 days.

(21) Appl. No.: 12/158,739

(22) PCT Filed: Dec. 22, 2006

(86) PCT No.: PCT/EP2006/070199

§ 371 (c)(1),
(2), (4) Date: Aug. 21, 2008

(87) PCT Pub. No.: WO2007/071794

PCT Pub. Date: Jun. 28, 2007

(65) Prior Publication Data

US 2008/0304535 A1     Dec. 11, 2008

(30) Foreign Application Priority Data

Dec. 22, 2005     (EP) .................................. 05292786

(51) Int. Cl.
*H01S 3/08* (2006.01)
*G02B 5/18* (2006.01)

(52) U.S. Cl. ........................... 372/102; 372/92; 372/98; 372/99; 359/558

(58) Field of Classification Search .................. 372/92, 372/98, 102, 99
See application file for complete search history.

(56) References Cited

U.S. PATENT DOCUMENTS

| 5,016,265 | A | | 5/1991 | Hoover |
| 5,255,278 | A | * | 10/1993 | Yamanaka ................ 372/45.01 |
| 5,485,499 | A | | 1/1996 | Pew et al. |
| 5,555,255 | A | * | 9/1996 | Kock et al. ..................... 372/96 |

(Continued)

FOREIGN PATENT DOCUMENTS

WO         01/09650 A2     2/2001

OTHER PUBLICATIONS

Avrutskii, I. A., et al. "Spectral and laser characteristics of a mirror with a corrugated waveguide on its surface," Sov. J. Quantum Electron 16 (8), Aug. 1986, pp. 1063-1065.

(Continued)

*Primary Examiner*—Minsun Harvey
*Assistant Examiner*—Phillip Nguyen
(74) *Attorney, Agent, or Firm*—Griffin & Szipl, P.C.

(57) ABSTRACT

For increasing the power emitted by surface emitting lasers and for improving the spatial coherence of the laser beam, emitted in particular by disk lasers, microchip lasers and VCSELs having a relatively wide emitting area, the invention proposes to select a low order transverse cavity mode by means of a mirror structure (12) of high reflectivity, and of high angular selectivity. The mirror structure comprises a multilayer (14) receiving the optical beam (24) and a resonant grating mirror (16) following the multilayer and arranged for highly reflecting the optical beam in a narrow angular range at each side of a determined incidence angle.

11 Claims, 6 Drawing Sheets

U.S. PATENT DOCUMENTS

| | | | | |
|---|---|---|---|---|
| 5,627,847 | A | * | 5/1997 | Leger .......................... 372/9 |
| 5,726,805 | A | * | 3/1998 | Kaushik et al. ............. 359/589 |
| 5,745,511 | A | * | 4/1998 | Leger .......................... 372/19 |
| 6,661,830 | B1 | | 12/2003 | Reed et al. |
| 6,680,799 | B1 | * | 1/2004 | Parriaux et al. ............. 359/569 |
| 2003/0002622 | A1 | | 1/2003 | Martynov et al. |
| 2004/0174536 | A1 | | 9/2004 | Jourlin et al. |

OTHER PUBLICATIONS

Avrutsky, I.A. et al. "Reflection of a beam of finite size from a corrugated waveguide," Journal of Modern Optics, 1989, vol. 36, No. 11, pp. 1527-1539.

Chernov, V.A. et al., "Influence of x-ray beam spatial coherence on the diffuse scattering from multilayer mirrors," Journal of Applied Physics, vol. 92, No. 12, Dec. 15, 2002, pp. 7593-7598.

Erofeev, V.I. et al., "Numerical studies of multilayer gratings using the method of eigenvectors," Nuclear Instruments and Methods in Physics Research A 45, 1998, pp. 305-309.

Pigeon, F., et al., "Polarizing grating mirror for CW Nd:YAG Microchip Lasers," IEEE Photonics Technology Letters, vol. 12, No. 6, Jun. 2000, pp. 648-650.

Bisson, Jean-Francois et al., "Switching of emissivity and photoconductivity in highly doped $Yb^{3+}:Y_2O_3$ and $Lu_2O_3$ ceramics," Applied Physics Letters, vol. 90., No. 20, May 14, 2007.

Bisson, J.F., et al., "A polarization-stablized microchip laser using a resonant grating mirror," Applied Physics B Lasers and Optics, 2006, pp. 519-524.

International Search Report issued in corresponding application No. PCT/EP2006/070199, completed Aug. 3, 2007 and mailed Aug. 20, 2007.

* cited by examiner

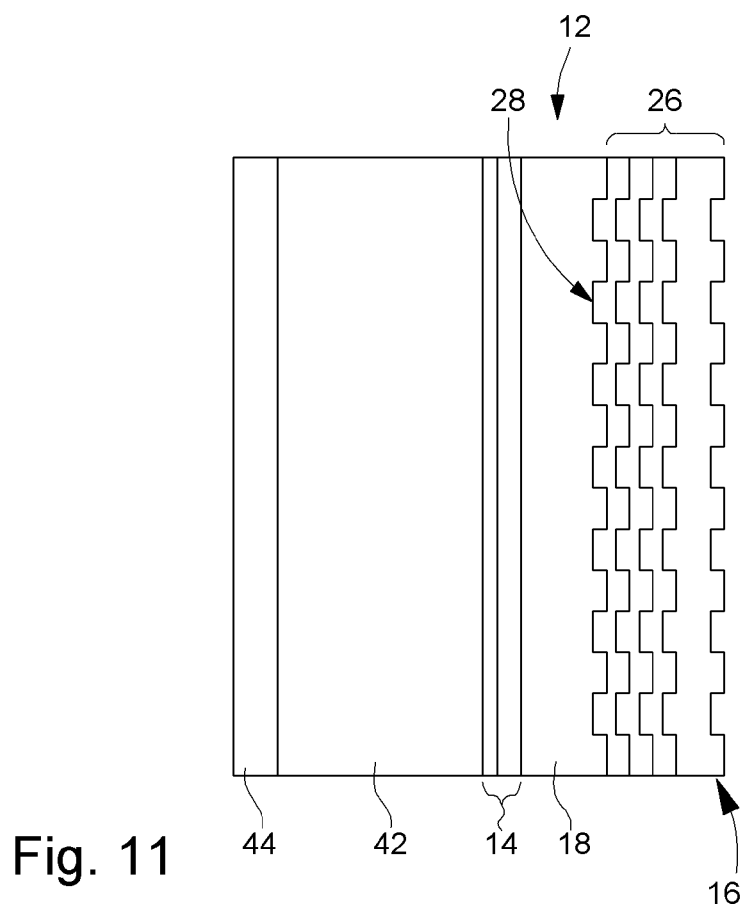
Fig. 11   44  42  14 18   16
Field emitted through angularly selective mirror structure
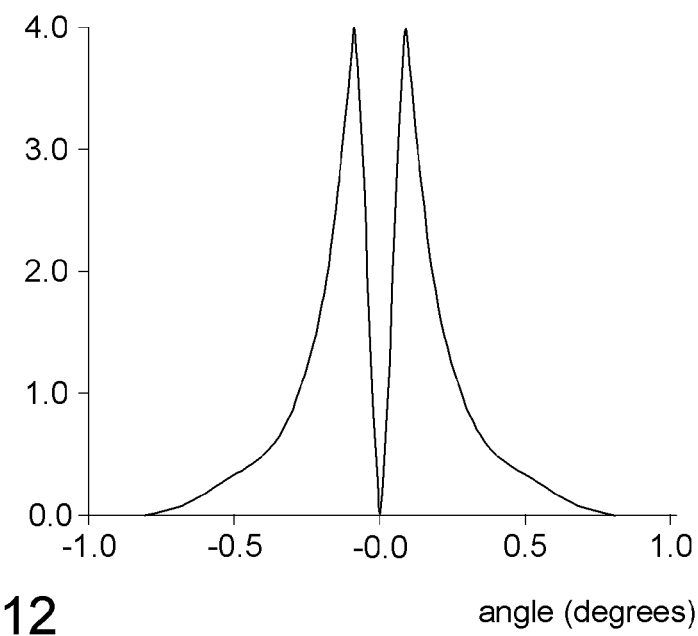
Fig. 12   angle (degrees)

MIRROR STRUCTURE AND LASER DEVICE COMPRISING SUCH A MIRROR STRUCTURE

This is a National Phase Application in the United States of International Patent Application No. PCT/EP2006/070199 filed Dec. 22, 2006, which claims priority on European Patent Application No. 05292786.0, filed Dec. 22, 2005. The entire disclosures of the above patent applications are hereby incorporated by reference.

FIELD OF THE INVENTION

The present invention concerns a mirror structure which is angularly selective. The present invention also concerns laser devices equipped with such a mirror structure for selecting the fundamental transverse cavity mode and thus improving the spatial coherence of these devices. In particular, the present invention concerns VCSELs, disk lasers and microchip lasers.

BACKGROUND OF THE INVENTION

Laser devices having an active medium of small length like disk lasers, microchip lasers or VCSELs (Vertical Cavity Surface Emitting Laser) or surface emitting organic material lasers emit an optical power which is substantially proportional to the emission area. For several applications, such laser devices with a relatively high optical power are required. However, a problem occurs by increasing the emission area because the spatial coherence of the emitted beam decreases. This loss of spatial coherence results from the excitation of several transverse modes. This is schematically represented in FIGS. 1A and 1B. On FIG. 1A is represented a disk laser 2 emitting substantially only the fundamental mode, the wave fronts 4 of which are shown. On FIG. 1B is represented a disk laser 6 having a wider emitting surface and emitting several transverse modes, the resulting distorted wave front 8 being schematically shown.

A solution is proposed by the company Novalux whereby the control of the transverse mode spectrum of a wide area VCSEL is achieved by an external mirror. Such solution is not compatible with low cost batch manufacturing technologies. Another solution is proposed by the company Alight whereby the outer multilayer mirror of a VCSEL is pierced by deep holes distributed in the form of a ring surrounding the circular emission area and providing a photonic crystal transverse feedback controlling the emitted transverse mode spectrum. Such solution is difficult to realize technologically and represents a strong perturbation of the whole VCSEL structure.

Compact microchip Q-switched lasers delivering at least millijoule pulses in a single transverse mode are desired for many applications [Ref. M. Weinrotter, H. Kopecek and E. Wintner, Laser Ignition of engines, Laser Physics, 15(7), 947, 2005]. However, the short length of the microchip resonator limits the size of the fundamental mode to several tens of $\mu m$, while the energy per unit area is limited to a fraction of the saturation parameter of the material, typically in the order of or less than a few $J/cm^2$ [Dong J., Opt. Rev. 12(3), 170-178, 2005]. Consequently, mode size in the order of several hundreds of $\mu m$ is required, but this is impossible to obtain with current state-of-the-art microchip lasers.

Selective laser mirrors comprising a multilayer and a resonant grating next to the latter or integrated into the latter are disclosed in document WO 01/09650 A2 and document "Polarizing grating mirror for CW Nd:YAG microchip laser" by F. Pigeon, O. Parriaux, Y. Ouerdane, A. V. Tishchenko, IEEE Photonics Technology Letters, Vol. 12, June 2000, pp. 648-650. These documents associate one multilayer and one waveguide grating submirrors in a destructive interference scheme to induce a reflection coefficient difference between the two polarizations emitted by a laser so as control the emitted polarization by filtering out the polarization which is coupled to a waveguide mode of the grating waveguide. These documents describe a polarization selection mechanism which relies upon the excitation of one waveguide mode in one direction by means of a 1-D grating pattern. There is no teaching in these documents as to how to achieve polarization independent transverse mode control of a wave emitted by a laser.

SUMMARY OF INVENTION

An object of the invention is to provide a laser device which efficiently solves the problem of poor spatial coherence, in particular for high power, wide area surface emitting lasers.

The present invention proposes to use an angularly selective mirror at one of the ends of the laser cavity and being of the type which exhibits a larger reflection for a normally incident wave than for obliquely incident waves.

The wave corresponding to the fundamental transverse mode has a smaller angular aperture than the beams of higher order transverse modes. Therefore, the fundamental mode will have a higher reflection than these higher order modes.

Another object of the invention is thus to provide an angularly selective mirror structure of the type here above mentioned which, when defining an end mirror of a laser cavity, will act as a mode selector by allowing substantially only a low order transverse mode to be amplified, in particular the fundamental transverse mode, in this laser cavity.

Thus, the present invention concerns a laser mirror structure intended to define a laser cavity and comprising a multilayer and a resonant grating mirror formed by a grating associated with a waveguide, characterized in that said resonant grating mirror and said multilayer are arranged for acting together as a transverse mode selector of the laser cavity, the resonant grating mirror being highly reflective only for a narrow angular spectrum centered at a given incidence angle so that this resonant grating mirror defines an angularly selective mirror, said multilayer being arranged for adjusting the reflectivity of the laser mirror structure over a broad angular spectrum including said narrow angular spectrum, this reflectivity being selected so as to allow the lasing in said laser cavity of a determined transverse mode having substantially its angular spectrum contained in said narrow angular spectrum of said resonant grating mirror but to prevent the lasing of higher modes having their angular spectrum substantially wider than said narrow angular spectrum.

The object of the present invention is thus neither the control of the polarization nor the control of the longitudinal mode spectrum of a laser. Its object is to impose the single transverse mode lasing of a surface emitting laser by preventing the lasing of the higher order transverse modes which would otherwise be naturally generated.

There are two embodiments of the present invention which relate to the presence and the relative importance of thermal lens effect in the laser cavity. In the presence of weak thermal lens effect, the reflective angular filtering action of the resonant grating mirror of the mirror structure does not have to be strong to impose the lasing of the fundamental transverse mode of the laser cavity, therefore the transverse mode selective reflection which it provides is advantageously completed by a multilayer exhibiting high reflection. In the presence of high gain active material and strong thermal lensing effect, the reflective angular filtering action of the resonant grating mirror of the mirror structure has to be strong enough to impose the lasing of the fundamental transverse mode.

In the first embodiment, devoted to amplifying media where thermal lensing is relatively small like in thin and wide disk lasers and in VCSELs, the multilayer is a multilayer mirror providing a large reflection, but less than 100%. In particular, for a laser beam within a laser cavity having at least a low order transverse mode and other higher order transverse modes, said low order transverse mode is substantially more reflected than said other transverse modes so that the low order transverse mode will be dominant and finally the only lasing one.

Further, said multilayer and said resonant grating mirror are arranged one relative to the other in order to have a constructive superposition in the reflection direction of the field of said angular spectrum components reflected by both mirrors. The laser mirror structure comprises a buffer layer between the multilayer and the waveguide, this buffer layer having a thickness selected for decoupling this multilayer and this resonant grating mirror and for providing said constructive interference.

In the second embodiment, devoted to amplifying media of large gain where thermal lensing is relatively large like in thick and narrow disk lasers and in microchip lasers, the angularly selective structure is preferably used as an output coupler and its angular width is made substantially smaller than the natural divergence of the mode without angularly selective mirror.

In standard high-power microchip rare-earth-doped solid-state lasers with free propagation, thermal lensing represents one of the main mechanisms that determine the transverse size of the fundamental mode, generally of the order of several tens of micrometers. The associated divergence is of the order of a few mRad (few tenths of degree). The resonant grating technology allows to make angularly-selective structures that have up to one order of magnitude more narrow angular distribution. In this case, the resonant grating structure imposes, by the diffraction limit, the size of the reflected beam, while transmitting other waves with more inclined wavevectors.

The highest modal discrimination is achieved with the multilayer being an antireflection layer system. The reflection of close to 100% is all provided by the resonant grating mirror which is angularly highly selective to essentially reflect a plane wave. Reflection, therefore amplification, is only provided for the light wave having a wave front essentially parallel to the grating mirror plane. On the way back from the resonant mirror the wave is amplified, its wave front being curved by thermal lensing, reflected by the rear mirror and reaches the resonant grating mirror under an angular spectrum which is larger than the reflection angular width of the resonant mirror, and exits the laser cavity except the wave part with angular spectrum contained in the angular reflection spectrum of the resonant mirror which reflects back into the resonator cavity to be further amplified. In this case, the mirror structure of the invention preferably defines the output mirror of the laser cavity. The multilayer in this second embodiment is an antireflection multilayer to prevent the reflection of the amplified wave and the generation of higher order transverse modes. This represents an unstable laser cavity of a new type with angular selection. As the wave exiting the laser cavity is first generated by the wave satisfying the narrow angular spectrum of resonant reflection, its spatial coherence is high, therefore it can be focused in a small spot by means of the appropriate optical component although it is divergent.

The present invention also concerns a laser device comprising a cavity, characterized in that said cavity is formed by at least a mirror structure of the present invention as defined here above and arranged at least at one end of this cavity.

In particular, for the first embodiment, the laser device according to the invention is characterized in that said resonant grating mirror is arranged so that its angular width substantially corresponds to the angular aperture of the fundamental transverse cavity mode or is slightly larger than this angular aperture but smaller than the angular aperture of the next higher order transverse cavity mode. In the second embodiment, the angular width of the grating mirror is significantly smaller than the width of the same laser resonator without angularly selective mirror and determines the spatial extent of the fundamental mode.

In a laser cavity with a mirror structure according to the first embodiment, the transverse cavity modes of higher order have higher angular aperture than the fundamental transverse cavity mode and the reflectivity of said resonant grating mirror is selected so that the reflection of these higher order transverse cavity modes by said mirror structure is low enough for not allowing their amplification in the resonant cavity, but is high enough for said fundamental transverse mode that this mirror structure allows its amplification. In a laser cavity with a mirror structure according to the second embodiment where there is a relatively strong thermal lensing, the resonant grating essentially reflects the wave part having an angular spectrum contained in the angular spectrum of the resonant mirror. The reflected wave experiences amplification in the active medium but also a wave front curvature which implies that it at least partially transmits through the resonant mirror after amplification.

BRIEF DESCRIPTION OF THE DRAWINGS

The invention will be described hereinafter in more details using the following description, made with reference to the annexed drawings, given by way of non-limiting examples, in which:

FIG. 11 is the cross-sectional view of an example of 1D transverse mode filtering structure according to the second embodiment applied to a microchip laser; and FIG. 12 is the angular distribution of the output field of a transverse mode filtered microchip laser.

DETAILED DESCRIPTION OF THE ILLUSTRATIVE EMBODIMENTS

The description of the device of the invention is first made hereafter by referring to a 1-D mirror structure involving a multilayer 14 and a 1-D grating 16 for sake of simplicity. The mirror structure which will mostly be used is a 2-D structure, described in a second part of the description, using a 2-D grating controlling the transverse mode in two orthogonal directions in the cross-sectional plane of the emitted beam.

Figure 1A:
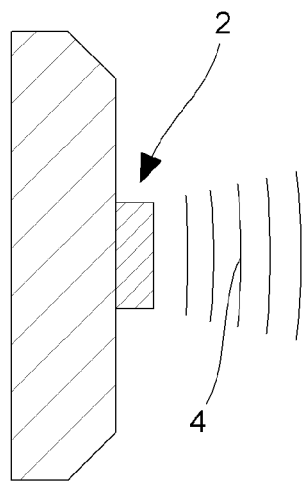
FIGS. 1a and b, already described, respectively show a disc laser having a small emitting area and a disc laser having a relatively wider emitting area.
Figure 1B:
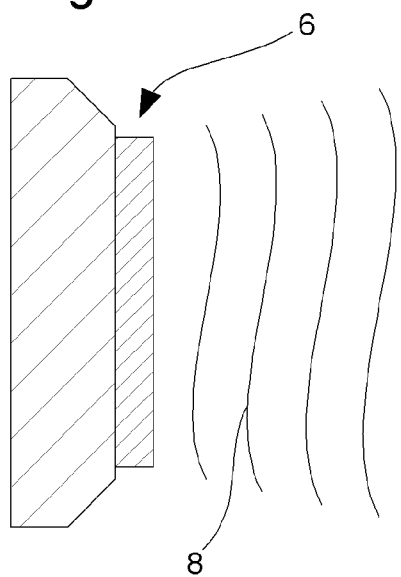
Figure 2:
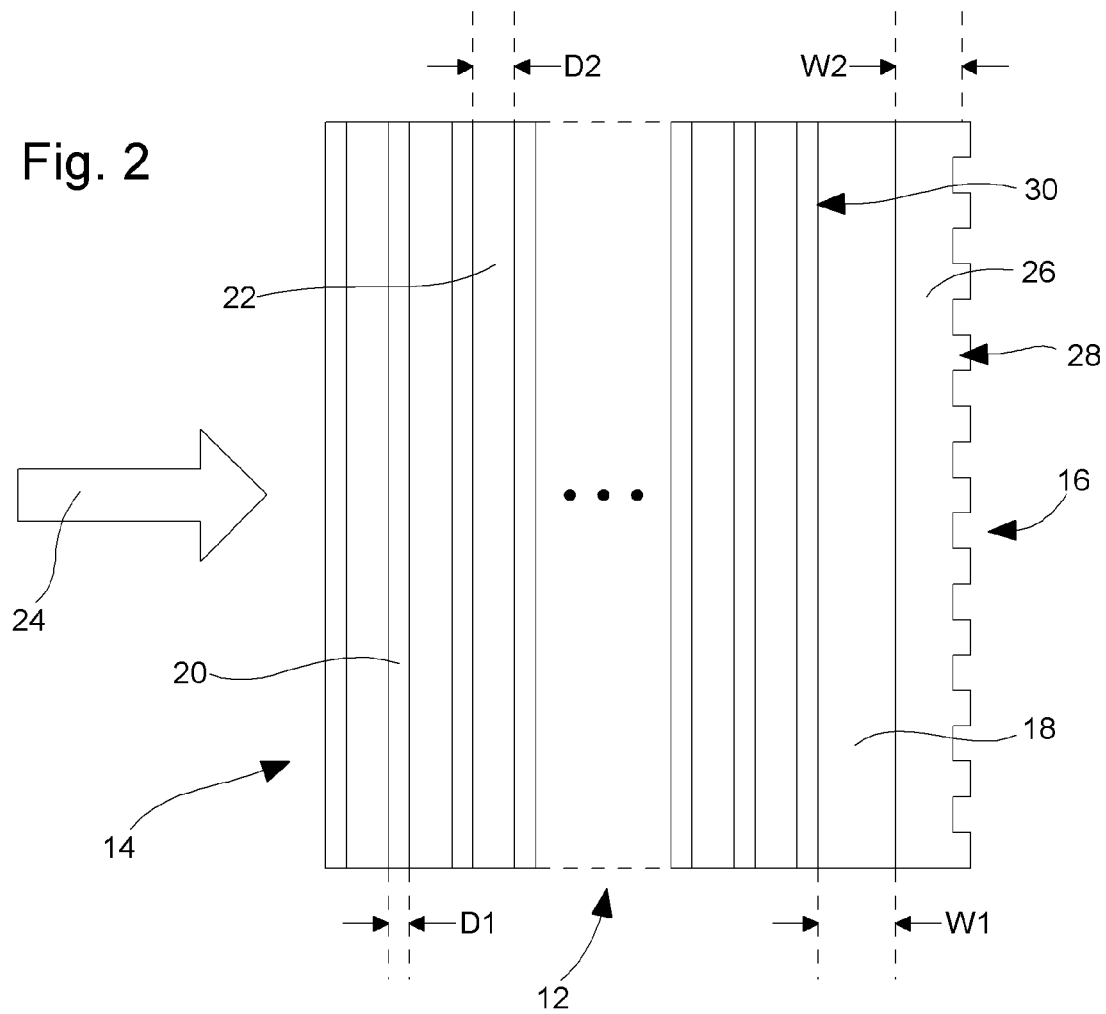
FIG. 2 shows a first variant of a mirror structure according to the invention.

On FIG. 2, the mirror structure 12 according to the invention is a combination of a multilayer 14 with a resonant grating mirror 16. A buffer layer 18 of thickness W1 and low refractive index $n_b$ defines an interface between multilayer 14 and resonant mirror 16. Buffer layer 18 has a thickness selected for decoupling the multilayer 14 and the resonant grating mirror 16, i.e. for isolating the guided mode of the slab waveguide 26 from the multilayer 14.

The first embodiment is characterized by relatively small thermal lensing. In this first embodiment, multilayer 14 is preferably a mirror composed of a stack of "$\lambda/4$" layers which have alternate low refractive index $n_l$ and high refractive index $n_h$. Layers 20 of high index thus have a thickness $D1=\lambda/4n_h$, $\lambda$ being the vacuum wavelength of a light beam 24 of given angular aperture for which the mirror structure 12 is arranged. Layers 22 of low index have a thickness $D2=\lambda/4n_l$. The resonant grating mirror 16 is formed by a slab waveguide 26 associated with a grating 28 arranged at the outer surface of the waveguide 26 which has an average thickness W2. The corrugation can also be arranged at the inner surface, or at both surfaces of waveguide 26. The grating 28 can also be an index modulation of waveguide 26. The period P of the grating 28 is defined by $P=\lambda/n_e$, where $n_e$ is the effective index of an exited mode of a given polarization in the grating slab waveguide 26 and is a function of $\lambda$, W2 and of the refractive index $n_w$ of the material of waveguide 26 as well as, to a lesser extent, of the parameters of the multilayer mirror. A person skilled in the art knows the dispersion equation allowing to determine P, W2 and the refractive index of the waveguide 26 in order to obtain a waveguide mode excitation with light beam 24 incident on grating 28 and having a defined wavelength $\lambda$. In particular, reference is made to the document of I. A. Avrutsky et al., "Spectral and laser characteristics of a mirror with a corrugated waveguide on its surface", Sov. J. Quantum Electron., Vol. 16, 1986, p. 1063 which discloses how and why a slab waveguide exhibits theoretically 100% light reflection upon mode excitation by an incident free space beam. The buffer layer thickness W1 is preferably larger than the modal field penetration depth in the buffer corresponding to a field decrease relative to its value at the buffer-waveguide interface down to 10% and given by $2.3\lambda/(2\pi(n_e^2-n_b^2)^{1/2})$, i.e., preferably larger than 350 nm in the VCSEL example given later.

In case the incident beam 24 makes in air an angle $\theta$ relative to the normal of the mirror 12 in a plan normal to mirror 12 and normal to the lines of grating 28, the period P is $P=\lambda/(n_e\pm\sin\theta)$, the + and − signs corresponding to the direction of propagation of the coupled guided mode of waveguide 26 with respect to the direction of the incident beam: the + sign corresponds to contradirectional coupling, the − sign corresponds to codirectional coupling. In case of oblique incidence, the quarter wave plate thickness is adjusted to the incidence angle. The main interest of the device of the invention corresponds to close to normal incidence.

For differentiating the reflection coefficient of the plane waves of beam 24 having close to normal angular spectral components from those plane waves having oblique angular spectral components, on the one hand, the inherently wide angular spectrum multilayer reflective mirror 14 is arranged for reflecting a major part but not substantially all of the power of the incident beam 24, preferably in the range 80% to 98% and in particular in the range 90% to 97%. On the other hand, the resonant grating mirror 16 is arranged for providing quasi total resonant reflection of the power transmitted by the multilayer mirror for a narrow angular spectrum around the normal as disclosed in document by I. A. Avrutsky and V. A. Sychugov: "Reflection of a beam of finite size from a corrugated waveguide", Journal of Modern Optics, Vol. 36, 1989, p. 1527. By so doing, the advantages of both mirrors are combined: usual multilayer mirrors can exhibit close to 100% reflectivity but they are only weakly selective angularly; for instance a 14 layer multilayer made of quarter wave layers of hafnium and silicon oxide exhibits a full angular width of more than 80 degrees at more than 90% reflection for both polarizations, the incidence medium being air. Conversely, resonant grating mirrors, formed on, or in a slab waveguide, are highly angularly selective but the grating gives rise to scattering losses so that it is very difficult in practice to obtain 100% reflection. For instance, a slab waveguide of $Ta_2O_5$ of 227 nm thickness with $SiO_2$ substrate and air cover having a 50 nm deep, 533 nm period binary grating at both sides exhibits an angular width of resonant reflection of a TE normally incident beam of a few tenths of degree in air. Furthermore, damages can occur with an incident beam of high power because the resonant reflection is associated with slab waveguide mode excitation and thus high energy accumulation in this slab waveguide. Therefore, the combination of high, essentially lossless reflection by the multilayer mirror with the high angular selectivity reflection of the resonant grating mirror ensures low loss, high angular selectivity, and high damage threshold reflection. This is an advantage of the first embodiment.

Figure 3:
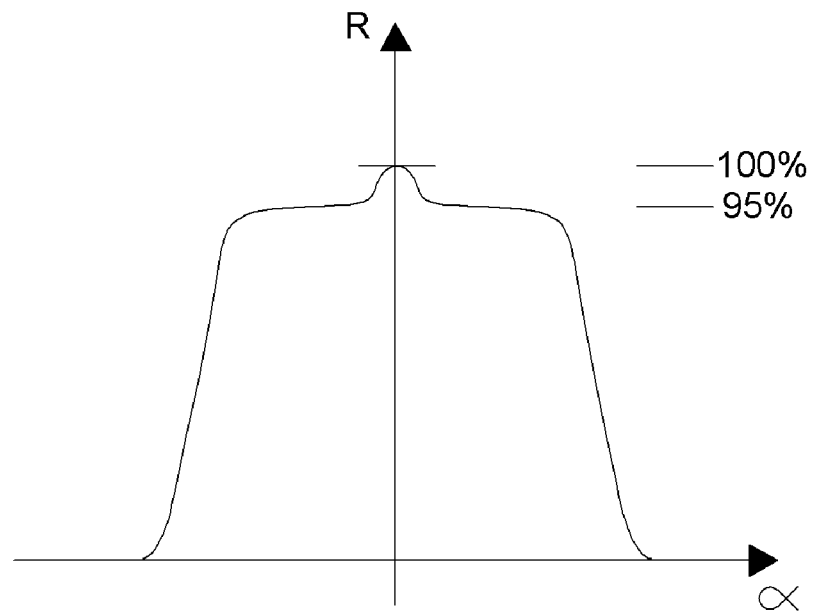
FIG. 3 schematically gives the reflection coefficient of the mirror structure of FIG. 2 in function of the incidence angle of a plane wave according to a first embodiment.

The mirror structure of the invention can be angularly selective enough for selecting only low order transverse cavity mode(s) in a laser device, in particular the fundamental transverse mode, without significantly decreasing the quality factor of the laser cavity. For instance, if the resonant mirror reflects back only 98% of the fundamental transverse mode incident on it and if the multilayer mirror reflects 95% of the light beam, this results in a reflection of 99.9% by the mirror structure of the invention for this fundamental transverse mode. A typical behavior of the reflection coefficient R of the mirror structure 12 in function of the incidence angle $\alpha$, defined relative to the normal to the grating general plane, is shown on FIG. 3.

A quarter wave multilayer mirror made of 29 alternate semiconductor layers of 3.08 and 3.52 refractive index exhibits at 980 nm wavelength a peak reflection of about 97% and a full angular width of 30° with a reflection larger than 95% in a semiconductor incidence medium. In another example where the layers have 1.48 and 2.11 index (silica and hafnium oxide), 12 layers suffice to ensure 96% reflection peak with a resulting 50° angular width at more that 95% reflection in a YAG incidence medium.

On FIG. 2, the buffer layer 18 has a thickness W1, the value of which is determined for obtaining a constructive interference of the light reflected back by the multilayer mirror 14 and by the resonant grating mirror 16.

The constructive interference condition between the multilayer reflected wave and the resonant grating reflected wave at interface surface 30 is:

$$2(2\pi(n_b W1+n_w W2)/\lambda)+\pi=2m\pi$$

where m is an integer and π is approximately the phase shift occurring at resonant reflection as known from the quoted documents by I. A. Avrutsky & al. The above expression is valid in the case where the grating 28 is made at the outer surface of waveguide 26. In case of oblique incidence, the above expression is modified accordingly. In case the corrugation is defined at both waveguide sides the constructive interference condition must be satisfied as given in the examples.

In the above formula, $n_b$ and $n_w$ are generally different from $n_l$ and $n_h$ respectively. For instance, in the case of a VCSEL, the multilayer can be made of III-V semiconductor materials whereas the buffer and waveguide layers can be made of metal oxides such as $SiO_2$, $Ta_2O_5$, $HfO_2$. This presents the advantage of having the resonant mirror structure 16 made according to a post-process, of leaving the VCSEL multilayer growth process unchanged, in particular of avoiding a regrowth process step. However, $n_b$ and $n_w$ may also be equal to $n_l$ and $n_h$ respectively if the materials composing the multilayer mirror 14 and the resonant mirror 16 may be the same.

The slab waveguide 26 can be composed of more than one layer and comprise several sublayers of different refractive index. The interface between said sublayers can be corrugated conformally to the undulation of grating 28, or they can be flat. Similarly to the case of a single layer waveguide, the multilayer waveguide propagates at least one guided mode of given polarization which is excited by the part of beam 24 incident on grating 28 after beam 24 has partially crossed multilayer mirror 14. The excitation of this guided mode similarly causes total resonant reflection of the part of beam 24 transmitted by mirror 14. The reason for slab waveguide 26 to be composed of more than one sublayer can be to create specific dispersion characteristics of the excited guided mode, for instance a different wavelength dependence of its effective index. It can particularly be to suppress the non-resonant Fresnel reflection of the beam transmitted by multilayer mirror 14 onto waveguide 26 so that the sole reflection mechanism in this waveguide is that of resonant reflection; this permits to ensure a symmetrical resonant reflection peak in the wavelength domain.

Figure 4:
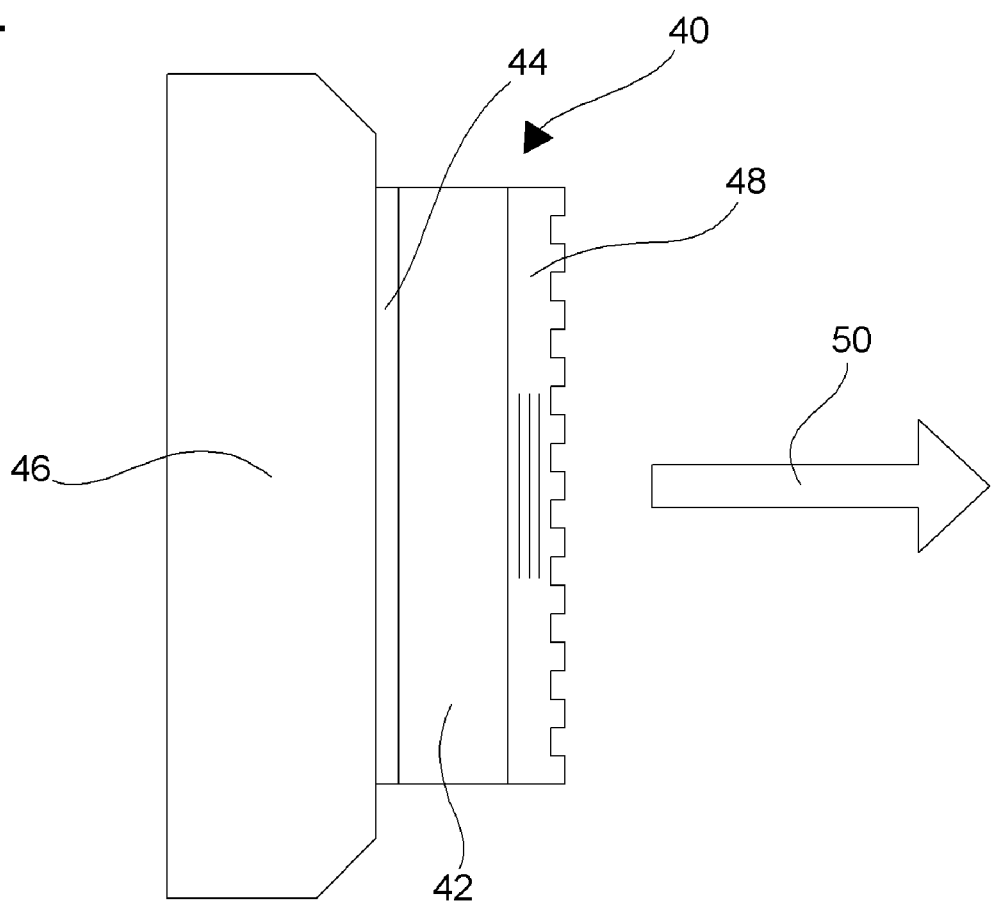
FIG. 4 represents a first embodiment of a laser device according to the invention

In FIG. 4 is schematically represented a laser device 40, in particular a disc laser, equipped with the mirror structure of FIG. 2. This laser device 40 comprises a resonant cavity defined by the active medium 42, a reflecting structure 44 at the surface of a heat sink base 46 and a mirror structure 48 according to the invention arranged at the outer end of the active medium and defining an output mirror of the laser device. In the present first embodiment the thickness of the active disk 42 is much smaller than its diameter (or its lateral dimension). This, in presence of a heat sink 46 as shown in FIG. 4, results in a particularly weak thermal lensing effect. The mirror structure 48 is arranged for selecting the fundamental transverse cavity mode. In this case, the resonant grating is arranged so that it does not totally reflect the light of the fundamental mode, but a small part goes through for forming the laser beam 50. It is however preferred that the laser beam exits the cavity through the other, non-resonant mirror 44 because its wave front will be closer to a Gaussian. If the laser output is at the grating side, the output field is composed of a distorted fundamental transverse mode profile with two lateral lobes in phase and a weaker amplitude at the center. Thus in a laser cavity equipped with a mirror structure according to the first embodiment of the invention, this mirror structure preferably defines the rear mirror.

The laser beam 50 is substantially formed by the fundamental transverse mode which propagates high power when the active medium 42 has a large emitting surface.

Figure 5:
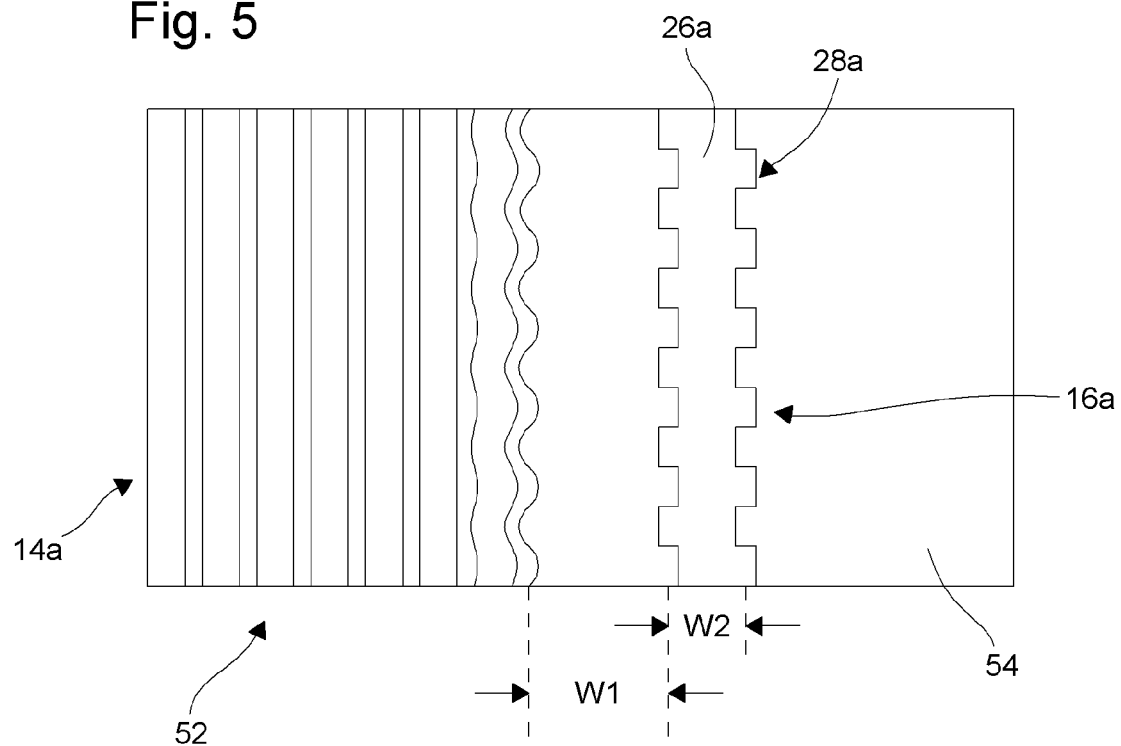
FIG. 5 shows a second variant of a mirror structure according to the invention.

FIG. 5 shows a second variant of a mirror structure according to the invention. This mirror structure 52 differs from the first embodiment mainly in that it forms an independent unit having its own substrate 54. The grating 28a of the resonant grating 16a is etched on the substrate 54. Then, the waveguide layer 26a is deposited in a conformal manner in this variant. However, the waveguide can also be deposited in a non conformal manner so that the grating 56 at the interface with the buffer layer 18a will have a lower and smoother amplitude than illustrated on FIG. 5. Then, the buffer layer 18a and the layers of the multilayer mirror 14a are deposited substantially in a non conformal manner. The degree of conformity of the interface undulations depends on the layer deposition technology. For instance in electron beam evaporation the corrugation smoothes out after a few layers whereas with ion plating deposition the conformity is almost perfect after more than ten layers. Whether the layers of the multilayer mirror are conformal or not is not an important issue because the corrugation of grating 16a is intended to excite a guided mode of layer 26a. If the corrugation is also present through the multilayer mirror, and if the corrugation depth is much smaller than the grating period, the multilayer reflects as well as a non-undulated multilayer.

The material of the substrate 54 is for example fused quartz in the visible and near infrared range and germanium or ZnSe in the infrared range. In case the substrate material has a larger refractive index than the effective index of the waveguide layer, an additional low index buffer layer is needed between waveguide 26a and substrate 54. In this second variant, the mirror structure 52 can be used as the output coupler of a single transverse mode laser in which case the reflection of the fundamental mode is smaller than 100%, or it can be used as the totally reflecting back mirror of a single transverse mode laser in which case the reflection of the fundamental mode is set close to 100%.

Figure 6:
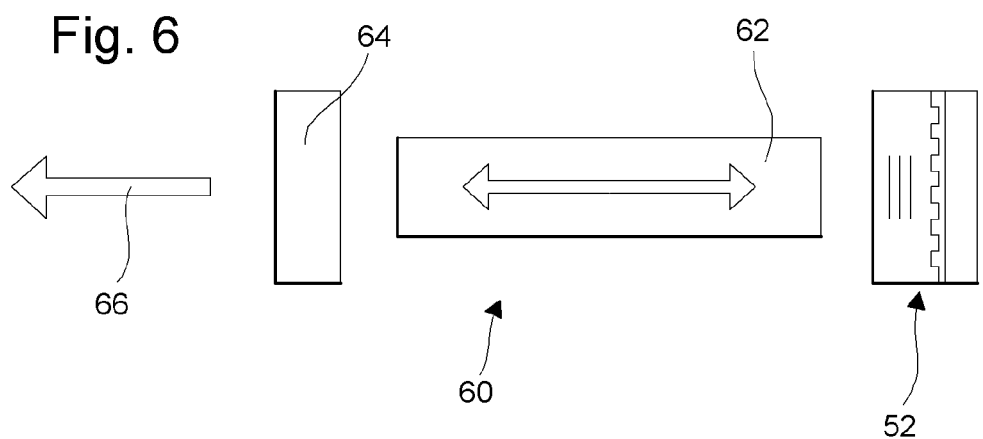
FIG. 6 shows a laser device comprising the mirror structure of FIG. 5.

In FIG. 6 a slab laser 60 comprising the mirror structure 52 of FIG. 5 is shown. This mirror structure 52 defines a rear mirror of the laser cavity in which the slab active medium 62 is located. The mirror structure 52 is arranged so as to reflect quasi totally at least one low order transverse cavity mode, this last modes being more reflected than other higher order transverse cavity modes.

The laser device 60 also comprises an output mirror 64 and provides a laser beam 66 which is formed substantially only by low order cavity transverse modes, in particular essentially by the fundamental transverse mode.

The angular width of the resonant mirror is adapted to the angular width or aperture of the fundamental transverse mode of the laser cavity, and is significantly smaller than the angular width of the higher order cavity transverse modes to limit the reflection loss of the fundamental transverse laser mode and to prevent the lasing of the higher order cavity transverse modes.

In case where the mirror structure of the invention is placed in the near field of the emitted wave, at a distance which is much smaller than the Fresnel distance, as it can be the case in VCSELs, the laterally confined emitted wave of essentially plane wave front is equivalent to a distribution of plane waves of different directions, the angular spectrum of the emitted wave being given by the Fourier transform of the spatial field distribution. The transverse mode filtering in this case amounts to adapting the angular width of the waveguide mode achieving resonant reflection to the Fourier spectrum of said emitted wave and defines a laser cavity transverse mode, usually the fundamental transverse mode. The higher order transverse modes have a larger angular width, and will therefore experience transmission losses at the angularly selective mirror.

In case the mirror structure of the invention is placed in the far field of the emitted wave, at a distance much larger than the Fresnel distance, the emitted wave is mainly defined by the natural resonator modes.

The incident beam is thus composed of plane waves, defined by the Fourier transform of the incident wave and by the propagation of the plane waves in free space. The total reflection of the waveguide grating mirror depends only on the angular power distribution of plane waves, so free space propagation doesn't affect the effective reflection. The transverse mode filtering in this case amounts to adapting the angular width of the waveguide mode to the angular spectrum of the incident wave.

In both near field and far field cases, the grating strength must be sufficient to ensure resonant reflection of an essentially normally incident beam of limited transverse size. If the grating is too weak, the mode coupled in the waveguide will propagate away outside the impact zone of the incident beam, and therefore be diffracted out without interference with the transmitted and reflected waves. The waveguide grating strength must therefore be large enough so that the coupled guided mode radiates almost all guided field within the incident beam impact zone.

Figure 7:
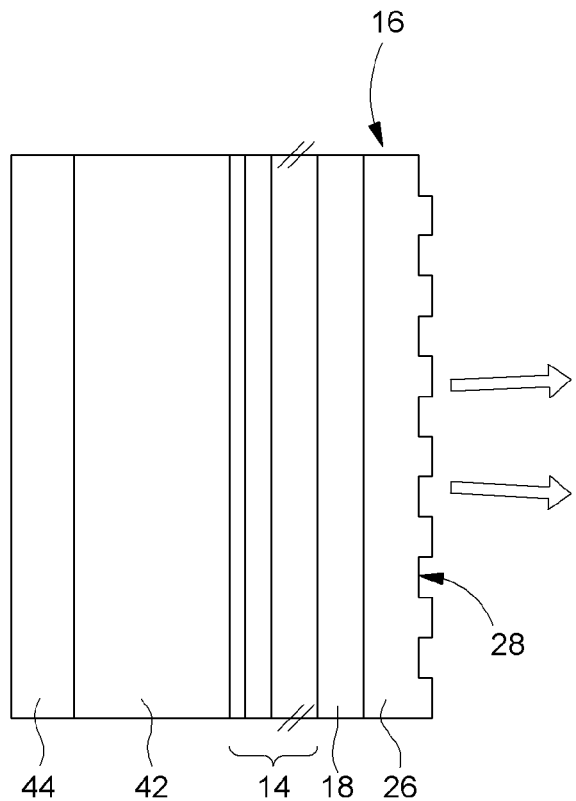
FIG. 7 shows a second embodiment of a mirror structure according to the invention.

In a laser cavity of the second embodiment shown in FIG. 7 the waveguide grating mirror 16 is used as a front mirror to provide an unstable resonator of relatively low quality factor. Multilayer 14 is an antireflection multilayer. Buffer layer 18 must simply be large enough to isolate the coupled waveguide mode in layer 26 from multilayer 14 and especially from the active zone which can have a refractive index larger than the waveguide mode effective index. Other references already described will not be described again.

In case where the mirror structure of the invention is placed in the near field of the emitted wave, at a distance which is much smaller than the Fresnel distance and the active medium has a positive or negative thermal lensing effect, as it can be the case in microchip lasers, the incident wave has significantly larger angular width than the angular width of the waveguide mode achieving resonant reflection and said wave therefore partially transmits through the waveguide resonant mirror. The reflected wave has an angular width defined by the waveguide resonant mirror. After a round trip in the resonator the reflected wave angular width increases because of the thermal lensing. The corresponding field distribution in the resonator can be considered as a resonator fundamental mode with a spatial transverse width defined by the pumped area. The wave reflected from the waveguide grating mirror has a coherence width $W_{ch}$ defined by the reflected wave angular width $\Delta\theta_{rr}$ due to resonant reflection $$W_{ch} \approx \lambda/\Delta\theta_{rr}$$

This coherence width is essentially equal to the effective propagation length if the waveguide of the excited mode in the presence of the grating. If the pumped area width does not exceed much the reflected beam coherence width, the conditions for the generation of higher order transverse modes in the cavity resonator are not satisfied.

In the presence of the antireflection multilayer 14 between the active medium and the resonant reflector, the effective waveguide grating mirror reflection is defined only by the degree of reflected wave distortion after a single round trip.

In case the mirror structure of the invention is placed in the far field of the emitted wave, at a distance much larger than the Fresnel distance and if the angular width defined by the waveguide resonant mirror is significantly smaller than the angular Fourier spectrum of the incident wave, this wave partially transmits through the waveguide resonance mirror. The reflected wave has an angular width defined by the waveguide resonant mirror and the spatial width of the reflected wave is larger than the spatial width of the incident wave. This effect modifies the resonator fundamental mode field distribution and as a result the fundamental mode transverse size is wider than the size of the resonator mode with an ordinary mirror. The higher order transverse modes have a larger angular width, and will therefore experience larger transmission losses at the angularly selective mirror.

The main interest of the device of the invention is for the two dimensions (2-D) filtering of transverse modes with mirror structures of the invention having a 2-D grating, such grating having a set of orthogonal grooves of identical period coupling the incident beam to a TE mode of the slab waveguide and achieving a 2-D transverse mode filtering in a laser device. As from here the description applies to both embodiments since it essentially concerns the resonant mirror 16. What was disclosed above concerning the multilayer 14 in both embodiments remains applicable in the 2-D case.

To operate as a transverse mode filter in both directions x and y, the two coupling events must be independent. This takes place in the 3-level pattern 70 illustrated in FIG. 8 wherein the white squares 72 represent the top of substantially square pillars, the vertically dashed squares 74 represent the bottom of square recesses, and the obliquely dashed squares 76 represent essentially flat squares located at a height between the top pillars and the bottom recesses. Such surface profile represents the sum of two orthogonal 1-D gratings.

The essentially normally incident polarization component 78 having its electric field in the y-direction is coupled to the x-propagating TE mode of the slab waveguide by means of the 1-D grating having its lines oriented in the y-direction whose period P in the x-direction is given by $P=\lambda/n_e$ where $n_e$ is the effective index of the coupled TE mode of the 2-D corrugated slab waveguide. The associated resonant reflection ensures angular filtering in a plane normal to the x-y plane and parallel to the x-axis. The essentially normally incident polarization component 80 having its electric filed in the x-direction is coupled to the y-propagating TE mode of the slab waveguide by means of the 1-D grating having its lines oriented in the x-direction whose period P in the y-direction is also $P=\lambda/n_e$. The associated resonant reflection ensures angular filtering in a plane normal to the x-y plane and parallel to the y-axis. As a result, the incident beam, emanating from the laser active medium or active zone, will be single transverse mode in both x- and y-directions. The 2-D transverse mode selection will also be polarization independent. It must be noted that there are another two directions, at 45 degrees from the first two directions, along which there is a periodic modulation of the waveguide thickness due to the presence of the 2-D grating. If the period P as defined above is set to couple the incident beam to the two orthogonally propagating TE modes along x and y, the equivalent period P $\sqrt{2}$ along the 45 degree orientation does not satisfy the coupling synchronism condition. If mode coupling along the 45 degree directions is desired, the period P must be multiplied by a factor $1/\sqrt{2}$. Such three level pattern is however difficult to achieve practically: it results from the successive exposure of two orthogonal 1-D interferograms in a photoresist layer in its linear regime. The resulting three level resist pattern is then physically transferred into the waveguide layer 26 by proportional reactive ion etching.

Figure 9:
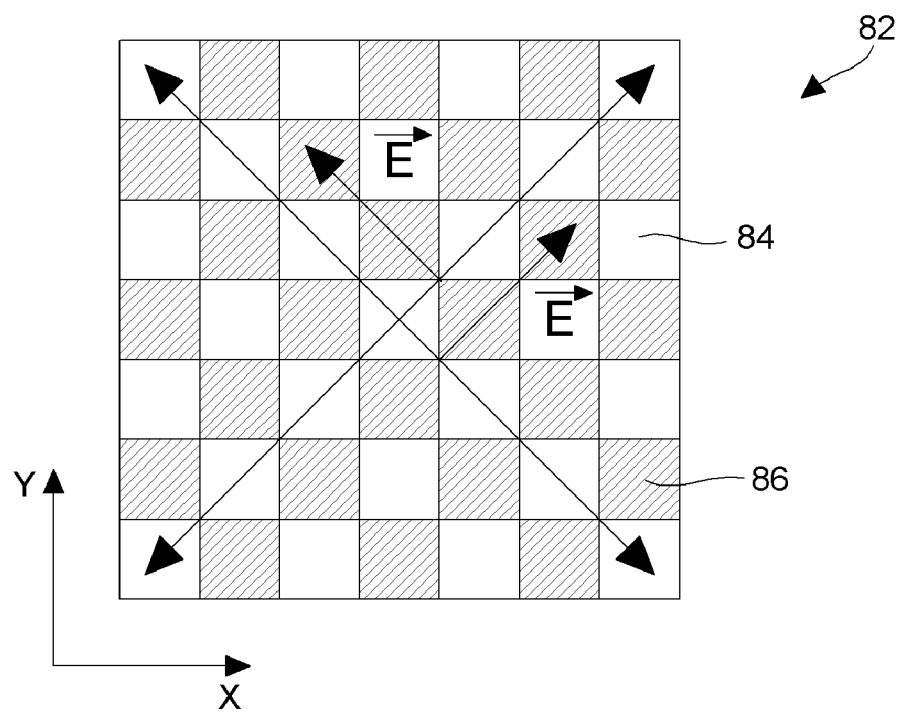
FIG. 9 shows a variant of a two dimensional mirror structure of the invention.

Another, technologically more easily achievable 2-D pattern 82 illustrated on FIG. 9 also ensures 2-D transverse mode filtering as the superposition of two orthogonal 1-D coupling events. It involves only two grating depth levels as a result of two 1-D interferograms projections in the non-linear photoresist regime or by direct projection of a 2-D grating mask; this 2-D surface relief corresponds to the product of two functions describing two orthogonal gratings. The white squares 84 represent the top of pillars, the dashed squares 86 represent the bottom of recesses. The diffraction spatial frequency spectrum of such a structure is essentially composed of two orthogonal $k_g$-vectors oriented along the diagonals of the chessboard pattern, the diffracting $k_g$-vector modules being equal to $1/\sqrt{2}$ time the K-vector of the two sets of straight lines forming the chessboard pattern 82. The reason for an essentially zero coupling strength between the incident beam and both TE modes propagating along x and y is the following: the average waveguide layer thickness in the x direction "seen" by the TE mode propagating along x is constant, there is no modulation, therefore essentially zero coupling; the same applies in the y direction. On the contrary, along the 45 degree directions there is on the average a significant modulation. Still defining $P=\lambda/n_e$ as the period necessary to couple the normally incident beam to a guided TE mode of the 2-D corrugated waveguide slab propagating along the diagonals, the period of the chessboard pattern along the x and y directions is $P/\sqrt{2}$. The directions of the actually diffracting $k_g$-vectors being set, the transverse mode filtering takes place similarly to the 3-level pattern described above relative to its $k_g$-vector directions.

To summarize the operation of the device of the invention according to its two embodiments, in the first embodiment devoted to laser cavities with weak thermal lensing, the resonant grating places the fundamental transverse mode above the lasing threshold as close as possible to 100% reflectivity whereas the higher order modes whose reflection is mainly provided by the multilayer remain below threshold. The fundamental mode exits the laser cavity preferrably through the mirror opposite the resonant mirror. In the second embodiment devoted to laser media of high gain and strong thermal lensing, the resonant mirror selectively reflects an essentially plane wave which gets amplified and whose wave front gets distorted. The resulting wave impinges, after a round trip in the laser cavity, under an angle which the resonant mirror does not totally reflects and therefore partially exits the cavity at the resonant grating side with an angular aperture at both sides but close to the angular spectrum of this resonant mirror as shown in FIG. 12. The multilayer is here antireflective to prevent intra-cavity oscillations which could give rise to higher order modes, the sole mirror being the close to 100% reflectivity resonant mirror and the 100% reflectivity rear mirror.

The whole description of the device of the invention has so far involved grating coupling to TE modes of the waveguide of the resonant mirror. It is also possible to use a TM mode for giving rise to the same transverse mode filtering function. Those familiar with the art will choose the polarization mode which is the best adapted to a particular set of structure and materials.

The described 2-D grating patterns are polarization independent; this means that the 2-D transverse mode filtering action is achieved whatever the polarization state of the incident wave. The control of the polarization emitted by the active layer can be achieved for instance by placing a 1-D polarization selective grating in the other mirror of the type disclosed by document WO01/09650. It can also be achieved by coupling the incident beam to a TE mode in the x direction and to a TM mode in the y direction, the periods along directions x and y being different.

Examples of 1D and 2D mirrors ensuring single transverse mode laser emission will now be given.

For sake of intelligibility, 1D examples of each embodiment will first be described.

Figure 10:
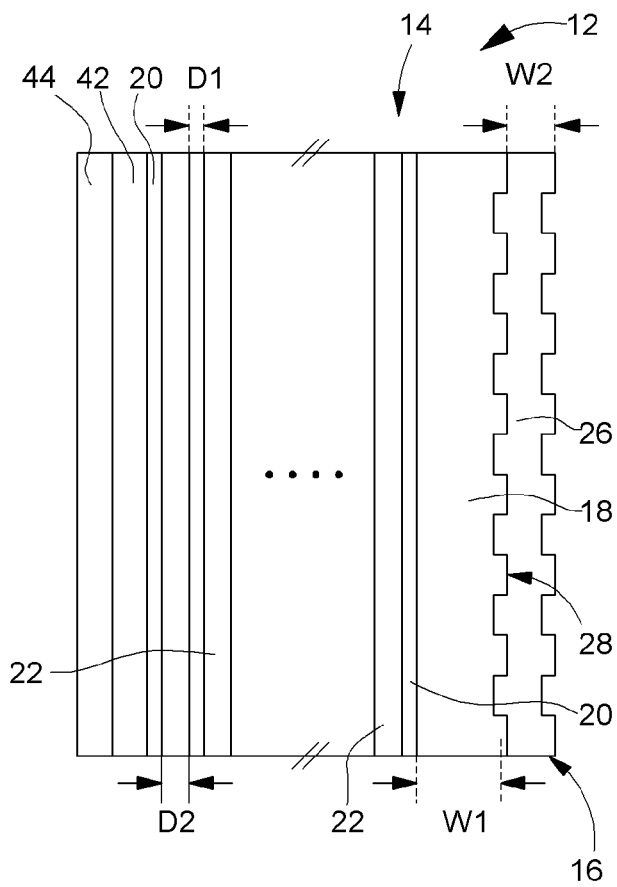
FIG. 10 is the cross-sectional view of an example of 1D transverse mode filtering structure according to the first embodiment applied to a VCSEL.

FIG. 10 is the transverse view of a Vertical Cavity Surface Emitting Laser (VCSEL) emitting at 980 nm wavelength comprising an output mirror 44 (not shown in detail), an active layer 42, and the angularly selective rear mirror 12 according to the first embodiment of the invention. The aim in the present example is to ensure single mode operation in a VCSEL of 15 micrometer diameter. The rear mirror comprises a multilayer mirror 14 composed of 29 semiconductor layers of AlGaAs of different refractive index of 3.08 and 3.52 of essentially quarter wave thickness D2 of 79.6 and D1 of 69.6 nm respectively, and a resonant mirror 16 composed of a low index buffer layer 18 and a corrugated high index waveguide 26. In the present example the resonant mirror is made of a metal oxide deposition technology, for instance the low index buffer layer is made of silicon dioxide and the high index waveguide is made of tantalum pentoxide (refractive index of approximately 1.49 and 2.19 respectively at 980 nm wavelength with ion plating deposition). These two layers can also be made of low and high index semiconductor compounds. The resonant mirror can also be composed of more than two layers. In order to provide constructive interference between the multilayer and resonant mirror reflections, and to isolate the $TE_0$ guided mode field of the waveguide from the multilayer, the average buffer layer thickness W1 is approximately 850 nm and the waveguide thickness W2 is approximately 260 nm. The grating 28 in the present example is made at the interface between the buffer and the waveguide layers. This permits to have a good tolerance in the grating etching technology since the average thickness of the waveguide layer is everywhere the same, essentially regardless of the grating depth and grating line/space ratio. The grating period is 533 nm and its line/space ratio is essentially 1/1. The grating depth is about 100 nm. The grating can also be placed at the top of the last high index layer at the air side but its depth will be larger.

With these data, the reflection pedestal provided by the multilayer is 95% and the reflection of the complete structure at the resonance wavelength of 980 nm is close to 100%. The spectral width of the resonant reflection peak is 45 nm. Such wide spectral width is a result of the requirement of a strong resonant grating to reflect the VCSEL beam which is very narrow. Such large spectral width does not give rise to higher order longitudinal modes because there is in VCSELs a natural selection of longitudinal modes which are far apart. The full angular width of the resonant reflection is about 1.62 degrees in the semiconductor material (corresponding to a Gaussian beam of about 10 micrometer width). The transverse modes of an unstable plane/plane cavity are essentially defined by the diameter D of the gain curve which in turn is defined by the diameter of the active zone. The divergence (or angular width) $\Delta\theta_m$ of the transverse mode m is approximately given by the expression $\Delta\theta_m = \lambda/(n(m+1)D)$ in a material of refractive index n, m=0 for the fundamental transverse mode. The angular width of the fundamental transverse mode in the semiconductor active material (n=3.08) is 1.22 degree and that of the first higher order transverse mode is 2.44 degrees. The presence of the (m+1) term at the denominator causes a large increase of the angular width between the fundamental transverse mode and the $1^{st}$ higher order transverse mode, therefore induces a strong discrimination between their reflection coefficient from the angularly selective mirror.

A second example of single transverse mode VCSEL will now be given. It ensures single transverse mode operation for a beam diameter of 50 µm. All layers are the same as in the VCSEL example ensuring single transverse mode operation of a 15 µm diameter beam. The grating period is still 533 nm and its line/space ratio is still essentially 1/1. The grating depth is about 50 nm. There are also conformal corrugations at each side of the waveguide layer.

With these data, the reflection pedestal provided by the multilayer is 95% and the reflection of the complete structure at the resonance wavelength of 980 nm is close to 100%. The full angular width of the resonant reflection is about 0.44 degree in the semiconductor material. The angular width of the fundamental mode is about 0.36 degree and that of the higher order transverse mode is 0.72 degree in the semiconductor material.

FIG. 11 is the transverse view of a microchip laser according to the second embodiment of the invention. It comprises a high reflectivity rear mirror 44, an active zone 42 made of Yb:YAG crystal or ceramic emitting in the 1030 nm wavelength range, and a mirror of the invention 12 composed of a multilayer 14 (here a bilayer suffices) suppressing the reflection between the active zone 42 and the resonant mirror 16 in order to prevent spurious longitudinal mode excitation. The resonant mirror 16 is composed of 5 layers of alternate high and low index inclusive of the low index buffer layer 18. The layer materials are in the present example silica and hafnium oxide; these materials have a refractive index of 1.48 and 2.11 at 1030 nm wavelength as deposited by means of ion plating. The sequence of layers from the active medium to air is: $SiO_2$:277 nm, $HfO_2$:222 nm, $SiO_2$ buffer: 1000 nm, $HfO_2$:37 nm, $SiO_2$:59 nm, $HfO_2$:129 nm, $SiO_2$:168 nm. The YAG substrate index is 1.817, the last four layers forming the waveguide. The grating 28 is made at the interface between the low index buffer layer 18 and the 4-layer resonant mirror 16. The corrugation is essentially conformal at the 5 interfaces. The 4-layer waveguide propagates at 1030 nm wavelength the sole fundamental mode $TE_0$. The period is 612 nm, the line/space ratio essentially 1/1, the depth is 25 nm. A layer deposition technology preserving the conformity of the grating undulation across successive interfaces like ion plating is preferred.

These data on the angularly selective mirror permit to generate a single mode YAG ceramic microchip laser of plane/plane cavity length of 1 mm in the presence of a thermal lensing effect of 100 mm focal length, pumped coaxially so that the gain profile is a Gaussian of 1 mm half-width. The angular width of the resonant mirror is about 0.06 degree in the active medium of 1.817 index and 0.12 degree in air. The angular distribution of the output field is shown in FIG. 12 in arbitrary units; its angular width is about 0.5 degree in air. The angular spectrum of FIG. 12 shows that the 0.07 degree wide central part is reflected back by the resonant mirror to be amplified in the laser cavity as described above.

The move from the two above examples of 1D structures to the corresponding 2D structures essentially concerns the resonant mirror part 16. The multilayer structure 14 of both embodiments (the mirror in the first embodiment and the antireflection multilayer in the second embodiment) remain essentially the same. The waveguide layer (or set of layers) 26 and related 2D corrugation couple the two polarizations of the normally incident beam in two orthogonal directions to the same guided mode, preferably the $TE_0$ mode. This imposes a redimensioning of the actual waveguide layer thickness and of the coupling grating strength. In the preferred case where the corrugation is at both sides of the waveguide layer or set of layers, the waveguide thickness remains close to the same as in the 1D case.

The second embodiment will first be considered. In the case of the three-level type of corrugation of FIG. 8, the grating depth of each of the orthogonal directions x and y of the 2D grating is essentially equal to the grating depth of the 1D grating; this means that the peak to trough depth of the three-level 2D grating is about twice that of the corresponding 1D grating, i.e., 50 nm; this corrugation gives rise to essentially the same reflection angular width along x and along y as the 1D grating of 25 nm depth described above. All layer thicknesses are the same as in the corresponding 1D example except the last layer which is 176 nm thick instead of 168 nm. The grating period is the same as in the 1D example: 612 nm. With these data the angular spectrum of the resonant grating along the x and y directions is close to the same as that of the 1D example.

In the case of the two-level corrugation of FIG. 9, which has a 2D pattern of a chessboard, where the periods along x and y are shorter by square root of 2 than the period of the 1D grating in order to ensure the period of the 1D grating in the directions making 45 degrees with respect to x and y, the thickness of the waveguide layers is the same except the last silica layer at the air side which is 206 nm thick instead of 168 nm. The depth of the binary corrugation is such that the first Fourier harmonic of the corrugation along these directions is the same as in the 1D grating, i.e. it is approximately $\pi/2$ times the depth of the 1D grating. Numerical modeling gives a grating depth of 40 nm. The period is 612/1.41 nm. With these data the angular spectrum of the resonant grating along the x and y directions is close to the same as that of the 1D example.

Finally, a third type of 2D grating corresponding to the second embodiment is given without picture. It is a two-level corrugation with the same period along x and along y as a 1D grating unlike in the 2D grating of FIG. 9. In this third type of two-level 2D corrugation, there are two orthogonal sets of rectilinear grooves of period along x and y equal to the period of the 1D corrugation leaving square pillars surrounded by the orthogonal grooves. The layer thicknesses are the same as in the 1D example except for the last silica layer at the air side which is 195 nm thick instead of 168 nm. The period is the same as in the 1D example: 612 nm. The $TE_0$ waveguide modes are excited in the x and y directions unlike in FIG. 9 where they are excited in the 45 degree directions. The first harmonic of the 2D corrugation in the x and y directions must essentially be equal to that of the 1D grating which implies here that the corrugation depth is about twice the corrugation depth of the 1D grating. Exact calculations show that the depth ensuring 100% resonant reflection and the same angular width along x an y as the 1D grating is 42 nm rather than 50 nm in this example corresponding to the 25 nm deep 1D grating. This corrugation gives rise to essentially the same reflection angular width along x and along y as the 1D grating of 25 nm depth described above. Note that, instead of square pillars emerging from a bottom plane, the corrugation can also be a set of square holes in a top plane.

The 2D structure of the first embodiment will then be considered. The same considerations can be made as in the case of the 2D structure of the second embodiment. Those familiar with the art will apply the same rationale as explained above in the case of the second embodiment, and use available codes to fine tune the optogeometrical parameters. Only a 2D corrugation present at both sides of the waveguide layer will be considered. The 2D example given here is that of a VCSEL emitting a single transverse mode 50 µm diameter beam; it corresponds to the 1D example described above. The 29 layer multilayer mirror is the same as that of the 1D example.

Figure 8:
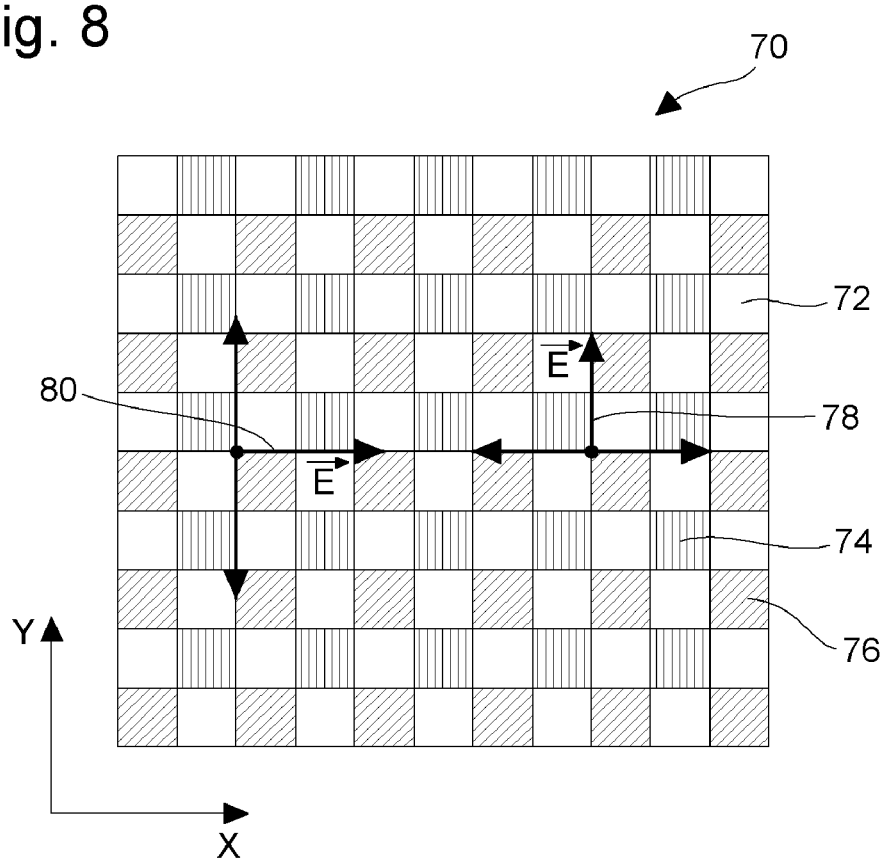
FIG. 8 shows a two dimensional mirror structure according to the invention.

In the case of the three-level type of corrugation of FIG. 8, the grating depth of each of the orthogonal directions x and y of the 2D grating is essentially equal to the grating depth of the 1D grating; this means that the peak to trough depth of the three-level 2D grating is about twice that of the corresponding 1D grating, i.e., 100 nm; this corrugation gives rise to essentially the same reflection angular width along x and along y as the 1D grating of 50 nm depth described above. All layer thicknesses are the same as in the corresponding 1D example except the waveguide layer which is 223 nm thick instead of 227 nm. The period along x and y is the same as in the 1D example: 533 nm. The angular width of the resonant mirror along the x and y directions is approximately equal to that given in the 1D example.

In the case of the two-level corrugation of FIG. 9, which has a 2D pattern of a chessboard, where the periods along x and y are shorter by square root of 2 than the period of the 1D grating in order to ensure the period of the 1D grating in the directions making 45 degrees with respect to x and y. The 29 layer multilayer and the buffer layer are the same as in the corresponding 1D example. The thickness of the waveguide layer is 233 nm instead of 227 nm. The depth of the binary corrugation is such that the first Fourier harmonic of the corrugation along these directions is the same as in the 1D grating, i.e. it is approximately $\pi/2$ times the depth of the 1D grating. Numerical modeling gives a grating depth of 75 nm. The period is 533/1.41 nm. With these data the angular spectrum of the resonant grating along the x and y directions is close to the same as that of the 1D example.

Another 2D single transverse mode VCSEL emitting a 50 m wide beam is finally described. The 2D grating is a two-level structure. This 2D corrugation is not that of FIG. 9. In this two-level 2D corrugation, there are two orthogonal sets of rectilinear grooves of period 533 nm along x and y equal to the period of the 1D corrugation leaving square pillars surrounded by the orthogonal grooves. The multilayer mirror and the buffer layer are the same as in the corresponding 1D example. The $TE_0$ waveguide modes are excited in the x and y directions unlike in FIG. 9 where they are excited in the 45 degree directions. The thickness of the waveguide layer is about 235 instead of 227 nm. The grating depth should be approximately twice the depth of the 1D grating. Fine tuning by means of an exact code leads to 85 nm rather than 100 nm in this example corresponding to the 50 nm deep 1D grating. This corrugation gives rise to essentially the same reflection angular width along x and along y as the 1D grating of 50 nm depth described above.

Note that the grating does not have to be strictly periodical. The line/space ratio, i.e. the ratio between the grating ridge width to the grating groove width can be different from 1 to 1 so as to laterally confine the excited guided mode in slab waveguide 26 under the impact zone of the beam 24 in cases where beam 24 is of small cross-section. A line/space ratio different from 1 to 1 increases the intra-guide second order reflection of the coupled mode, thus the mode propagation length in waveguide 26.

Note also that the grating groove profile does not have to be rectangular; it can be for instance sinusoidal.

The invention claimed is:

1. Laser mirror structure intended to define a laser cavity and comprising a multilayer and a resonant grating mirror formed by a grating associated with a waveguide propagating at least a guided mode, wherein said resonant grating mirror and said multilayer are arranged for acting together as a transverse mode selector of the laser cavity, the resonant grating mirror being highly reflective only for a narrow angular spectrum centered at a given incidence angle so that this resonant grating mirror defines an angularly selective mirror, said multilayer being arranged for adjusting the reflectivity of the laser mirror structure over a broad angular spectrum including said narrow angular spectrum, this reflectivity being selected so as to allow the lasing in said laser cavity of a determined transverse mode having substantially its angular spectrum contained in said narrow angular spectrum of said resonant grating mirror but to prevent the lasing of higher modes having their angular spectrum substantially wider than said narrow angular spectrum.

2. Laser mirror structure according to claim 1, wherein said given incidence angle corresponds to normal incidence on said laser mirror structure, and wherein said determined mode is a fundamental transverse mode of said laser cavity, the laser mirror structure forming an end of this laser cavity.

3. Laser mirror structure according to claim 1, wherein the thermal lensing effect in the active medium of said laser cavity is low and wherein said multilayer defines a multilayer mirror having a high reflectivity but less than 100% so that the major part but not all of the optical power of said determined transverse mode generated in said laser cavity is reflected by said multilayer mirror, this multilayer mirror and said resonant grating mirror being arranged one relative to the other in order to have a constructive interference in the reflection direction for said determined transverse mode.

4. Laser mirror structure according to claim 3, wherein it comprises a buffer layer arranged between said multilayer and said waveguide, this buffer layer having a thickness selected for decoupling this multilayer and said at least a guided mode and for providing said constructive interference.

5. Laser comprising a mirror structure according to claim 3, wherein this laser is a VCSEL or a thin and wide disk laser.

6. Laser comprising a mirror structure according to claim 3, wherein said mirror structure defines the rear mirror of this laser.

7. Laser mirror structure according to claim 1, wherein the thermal lensing effect in the active medium of said laser cavity is high and wherein said multilayer defines an antireflection structure so that only light waves reflected by the resonant grating mirror is reflected back into the laser cavity.

8. Laser mirror structure according to claim 7, wherein it comprises a buffer layer arranged between said multilayer and said wave guide for isolating said at least a guided mode from the multilayer and said active medium.

9. Laser comprising a mirror structure according to claim 7, wherein it comprises an amplifying media of large gain and wherein its cavity is an unstable cavity with a fundamental mode selection obtained by reflective angular filtering through said resonant grating mirror, said laser mirror structure defining the output mirror of the resonant cavity.

10. Laser according to claim 9, wherein this laser is a microchip laser or a thick and narrow disk laser.

11. Laser mirror structure or laser according to claim 1, wherein said grating has a two-dimension pattern for selecting a polarization independent transverse mode through the high angular selectivity of the resonant grating mirror.

* * * * *